(12) United States Patent
Yang et al.

(10) Patent No.: US 7,863,080 B1
(45) Date of Patent: Jan. 4, 2011

(54) PROCESS FOR MAKING MULTI-CRYSTALLINE SILICON THIN-FILM SOLAR CELLS

(75) Inventors: Tsun-Neng Yang, Taipei (TW); Shan-Ming Lan, Taoyuan County (TW); Chin-Chen Chiang, Taoyuan County (TW); Wei-Yang Ma, Taipei County (TW); Chien-Te Ku, Taoyuan County (TW); Yu-Hsiang Huang, Taoyuan County (TW)

(73) Assignee: Atomic Energy Council-Institute of Nuclear Energy, Lungtan, Taoyuan (TW)

( * ) Notice: Subject to any disclaimer, the term of this patent is extended or adjusted under 35 U.S.C. 154(b) by 0 days.

(21) Appl. No.: 12/007,154

(22) Filed: Jan. 7, 2008

(51) Int. Cl.
*H01L 21/00* (2006.01)

(52) U.S. Cl. .................. 438/73; 136/244; 136/261; 257/431; 257/E21.361; 438/57

(58) Field of Classification Search ............... 257/431, 257/E21.361; 438/57, 73; 136/244, 261
See application file for complete search history.

(56) References Cited

U.S. PATENT DOCUMENTS 3,961,997 A * 6/1976 Chu .......................... 438/97

* cited by examiner

*Primary Examiner*—Asok K Sarkar
(74) *Attorney, Agent, or Firm*—Jackson IPG PLLC; Demian K. Jackson

(57) ABSTRACT

Dichlorosilane and diborane are deposited on the titanium-based alloy film to grow a $p^+$ type back surface field film. The temperature is raised to grow a $p^-$ type light-soaking film on the $p^+$ type back surface field film. Phosphine is deposited on the $p^-$ type light-soaking film to form an $n^+$ type emitter. Thus, an $n^+$-$p^-$-$p^+$ laminate is provided on the titanium-based alloy film. SiCNO:Ar plasma is used to passivate the $n^+$-$p^-$-$p^+$ laminate, thus forming an anti-reflection film of $SiCN/SiO_2$ on the $n^+$ type emitter. The $n^+$-$p^-$-$p^+$ laminate is etched in a patterned mask process. A $p^-$ type ohmic contact is formed on the titanium-based alloy film. The anti-reflection film is etched in a patterned mask process. The $n^+$ type emitter is coated with a titanium/palladium/silver alloy film that is annealed in hydrogen. An $n^-$ type ohmic contact is formed on the $n^+$ type emitter.

19 Claims, 15 Drawing Sheets

PROCESS FOR MAKING MULTI-CRYSTALLINE SILICON THIN-FILM SOLAR CELLS

BACKGROUND OF INVENTION

1. Field of Invention

The present invention relates to a process for making multi-crystalline silicon thin-film solar cells and, more particularly, to a high-temperature process for making multi-crystalline silicon thin-film solar cells based on plasma-enhanced chemical vapor deposition.

2. Related Prior Art

Silicon-based solar cells are generally made in low-temperature processes based on plasma-enhanced chemical vapor deposition ("PECVD"). An amorphous or microcrystalline silicon film is coated on a substrate of glass, aluminum, silicon, stainless steel or plastics. A back contact is made of aluminum, gold, silver or transparent conductive oxide such as indium-tin oxide ("ITO") and zinc oxide.

The primary advantage of the low-temperature processes is the wide variety of materials that can be used to make the substrates. However, they suffer drawbacks such as defective silicon films, low photoelectrical conversion efficiencies and low light-soaking stability. In the PECVD, while coating the microcrystalline silicon film, a silicon material is highly diluted in hydrogen according to the following notion:

$$[H_2]/[SiH_4] > 15$$

That is, the concentration or flow rate of $H_2$ is more than 15 times as high as that of $SiH_4$. The problems with the PECVD include a low growth rate of the film, a long process and a high cost.

Regarding the making of the multi-crystalline silicon solar cells, there are various techniques such as solid phase crystallization ("SPC") and aluminum-induced crystallization ("AIC").

The SPC is based on the PECVD. In the SPC, an amorphous silicon film is deposited, intensively heated and annealed at a high temperature. Thus, a multi-crystalline silicon film with a grain size of 1 to 2 micrometers is made.

There are however problems with the low-temperature processes for making multi-crystalline silicon solar cells based on the PECVD. Firstly, many defects occur in the silicon films. Secondly, the photoelectrical conversion efficiencies are low. Thirdly, the light soaking stabilities are low. Fourthly, the growth rates of the films are low. Sixthly, the processes are long. Seventhly, the costs are high.

Referring to FIGS. 11 through 15, in the AIC, a substrate 71 is coated with an aluminum film 72. An amorphous silicon film 73 is coated on the aluminum film 72 based on the PECVD and annealed at a temperature of 575 degrees Celsius for a long time to form a seed film 74. Then, it is subjected to an epitaxial process such as the PECVD or an electron cyclotron resonance chemical deposition ("ECR-CVD") to make a multi-crystalline silicon film 75. The AIC however involves many steps and takes a long time. The resultant grain size is 0.1 to 10 micrometers.

A conventional silicon-based tandem solar cell includes an upper laminate and a lower laminate. The upper laminate is an amorphous silicon p-i-n laminate. The lower laminate is a microcrystalline silicon p-i-n laminate. Thus, the infrared and visible light of the sunlit can be converted into electricity. However, the photoelectrical conversion efficiency of the conventional silicon-based tandem solar cell deteriorates quickly.

Concerning the process for making multi-crystalline silicon solar cells based on the AIC, the processes are long for including many steps and therefore expensive. As for the conventional silicon-based tandem solar cell, the photoelectrical conversion efficiency deteriorates quickly.

The present invention is therefore intended to obviate or at least alleviate the problems encountered in prior art.

SUMMARY OF INVENTION

It is the primary objective of the present invention is to provide a process for making a tandem solar cell.

To achieve the primary objective, a titanium-based alloy film is provided on a ceramic substrate. Dichlorosilane and diborane are deposited on the titanium-based alloy film to grow a $p^+$ type back surface field film. The temperature is raised to grow a $p^-$ type light-soaking film on the $p^+$ type back surface field film. Phosphine is deposited on the $p^-$ type light-soaking film to form an $n^+$ type emitter. Thus, an $n^+$-$p^-$-$p^+$ laminate is provided on the titanium-based alloy film. SiCNO:Ar plasma is used to passivate the $n^+$-$p^-$-$p^+$ laminate, thus forming an anti-reflection film of SiCN/SiO2 on the $n^+$ type emitter. The $n^+$-$p^-$-$p^+$ laminate is etched in a patterned mask process. A $p^-$ type ohmic contact is formed on the titanium-based alloy film. The anti-reflection film is etched in a patterned mask process. The $n^+$ type emitter is coated with a titanium/palladium/silver alloy film that is annealed in hydrogen. An $n^-$ type ohmic contact is formed on the $n^+$ type emitter.

Other objectives, advantages and features of the present invention will become apparent from the following description referring to the attached drawings.

BRIEF DESCRIPTION OF DRAWINGS

The present invention will be described via the detailed illustration of the preferred embodiment referring to the drawings.

DETAILED DESCRIPTION OF PREFERRED EMBODIMENT

Figure 1:
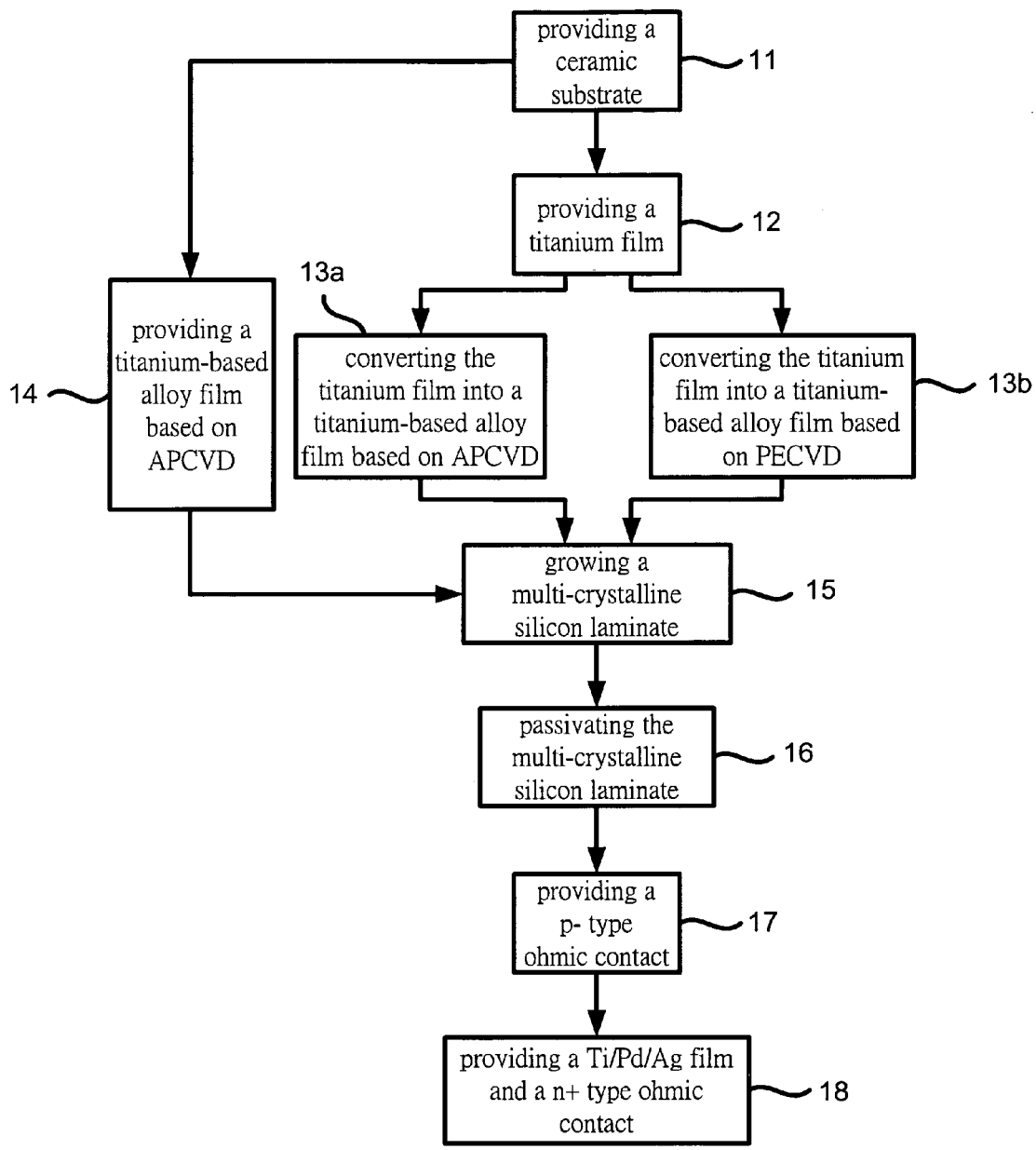
FIG. 1 is a flowchart of a process for making multi-crystalline silicon thin-film solar cells according to the preferred embodiment of the present invention.

Referring to FIG. 1, there is shown a process for making multi-crystalline silicon thin-film solar cells according to the preferred embodiment of the present invention.

Figure 2:
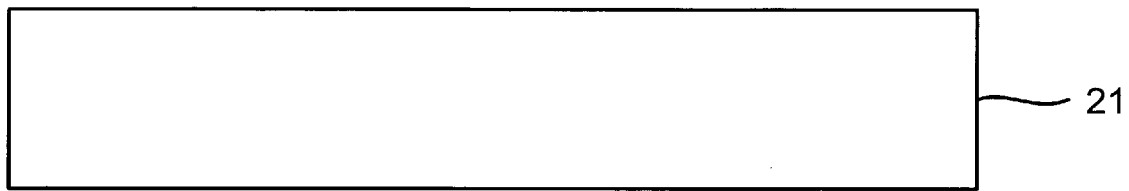
FIG. 2 is a side view of a ceramic substrate for use in the process shown in FIG. 1.

Referring to FIGS. 1 and 2, at 11, a ceramic substrate 21 is provided. The ceramic substrate 21 is made of aluminum oxide. The thickness of the substrate 21 is 0.1 to 1.0 mm.

Figure 6:
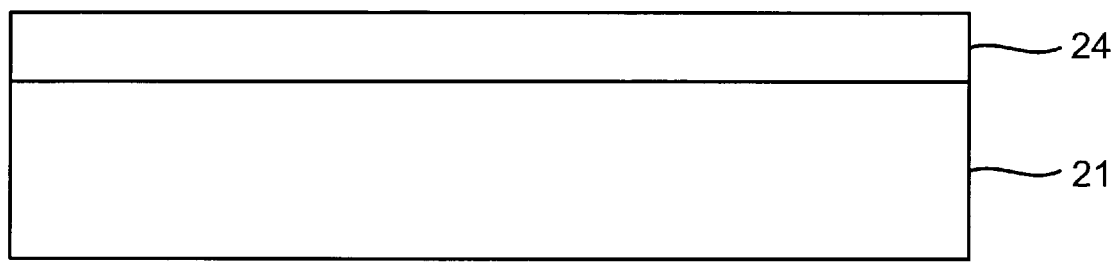
FIG. 6 is a side view of a $p^+$ type multi-crystalline silicon back surface field converted from the amorphous silicon film and the titanium-based alloy film shown in FIG. 5.

The ceramic substrate 21 is coated with a titanium-based alloy film 24 (FIG. 6). The titanium/silicon alloy film 24 may be made of $TiSi_2$, TiN, TiC, $TiB_2$ or $TiC_xN_y$. The titanium-based alloy film 24 can be provided in three subroutines.

Figure 3:
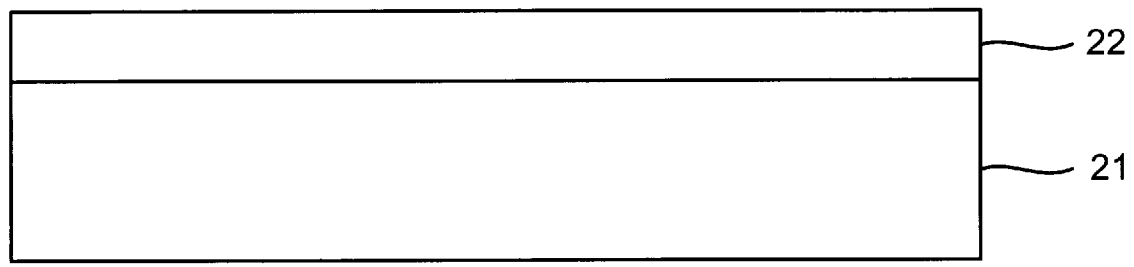
FIG. 3 is a side view of a titanium-based alloy film coated on the ceramic substrate in the process shown in FIG. 2.

In the first subroutine, at 12 (FIGS. 1 and 3), a titanium film 22 is coated on the ceramic substrate 21 in an e-gun evaporation system at 250 degrees Celsius. The thickness of the titanium film 22 is 1000 to 5000 angstroms.

Figure 4:
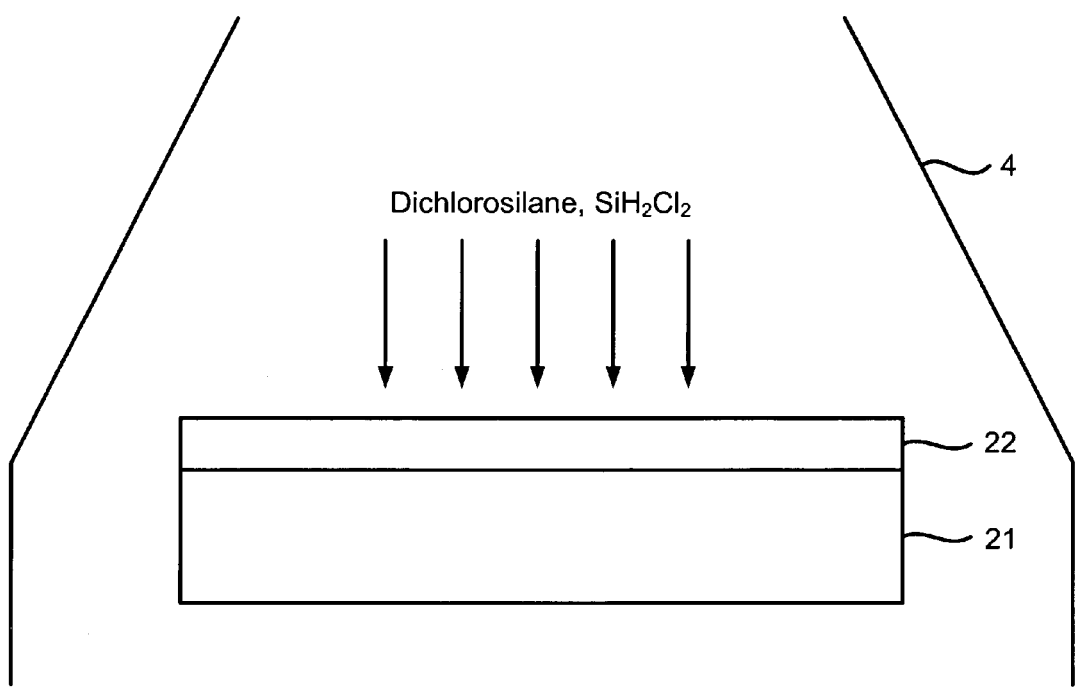
FIG. 4 is an atmospheric chemical vapor deposition apparatus for processing the laminate shown in FIG. 3.

At 13a (FIGS. 1 and 4), dichlorosilane is deposited on the titanium film 22 in an atmospheric pressure chemical vapor deposition ("APCVD") apparatus 4, at 800 to 1100 degrees Celsius. The dichlorosilane and the titanium film 22 exchange silicon atoms and titanium atoms to form the titanium/silicon alloy film 24. The grain size of the titanium/silicon alloy film 24 is larger than 1 micrometer. The sheet resistance of the titanium/silicon ally film 24 is lower than ohm/cm².

Figure 5:
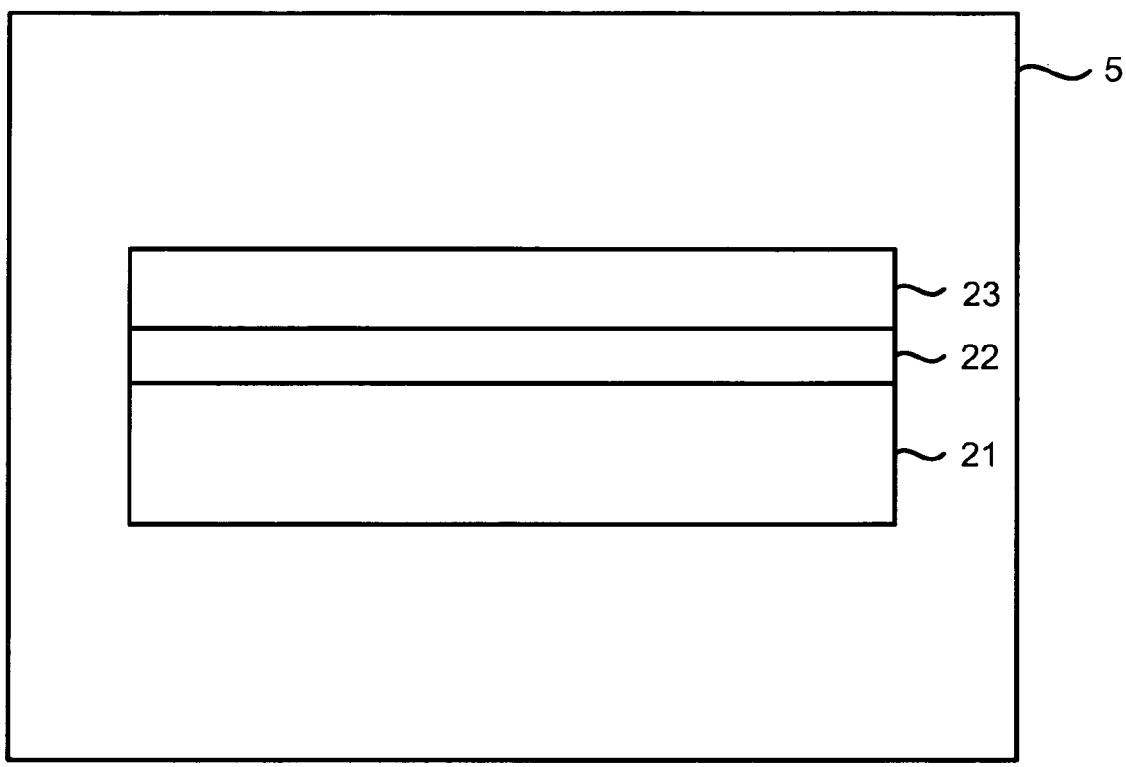
FIG. 5 is a side view of an amorphous silicon film coated on the titanium-based alloy film shown in FIG. 4.

In the second subroutine, at 12 (FIGS. 1 and 3), a titanium film 22 is coated on the ceramic substrate 21 in an e-gun evaporation system at 250 degrees Celsius. The thickness of the titanium film 22 is 1000 to 5000 angstroms. At 13b (FIGS. 1 and 5), an amorphous silicon film 23 is coated on the titanium film 22 in a plasma-enhanced chemical vapor deposition ("PECVD") apparatus. Alternatively, the amorphous silicon film 23 may be coated on the ceramic substrate 21 before the titanium film 22 is coated on the amorphous silicon film 23. In either case, the ratio of the thickness of the amorphous silicon film 23 to the thickness of the titanium film 22 is 2:1.

The titanium film 22 and the amorphous silicon film 23 are heated in a high-temperature annealing apparatus 5 at 700 to 900 degrees Celsius so that they exchange titanium atoms and silicon atoms, thus forming the titanium/silicon alloy film 24. Then, the temperature in the APCVD apparatus 5 is raised to a value-higher than 1000 degrees Celsius for the epitaxial growth of the grains. The size of the grains of the titanium/silicon alloy film 24 is larger than 1 micrometer. The sheet resistance of the titanium/silicon alloy film 24 is lower than ohm/cm².

In the third subroutine, dichlorosilane and titanium tetrachloride are made to react with each other to form the titanium/silicon alloy film 24 in the APCVD apparatus 4.

Figure 7:
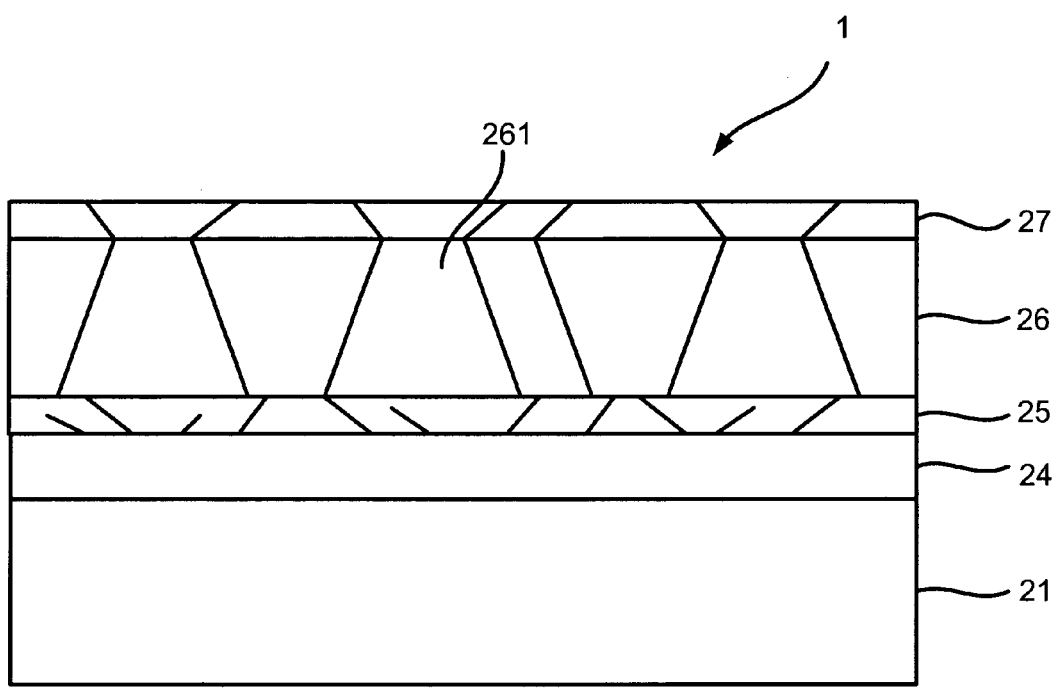
FIG. 7 is a side view of an n-i-p multi-crystalline silicon laminate coated on the laminate shown in FIG. 6.

Referring to FIGS. 1 and 7, at 15, dichlorosilane and diborane are made to exchange silicon atoms and boron atoms in the APCVD apparatus 4 at 900 to 1000 degrees Celsius, thus forming a type multi-crystalline silicon back surface field film 25.

The temperature in the APCVD apparatus 4 is raised to a value higher than 1000 degrees Celsius. More dichlorosilane and diborane are made to exchange silicon atoms and boron atoms, thus forming a p⁻ type multi-crystalline silicon light-soaking film 26 on the p⁺ type multi-crystalline silicon back surface field film 25, which is used as a seed layer. The epitaxial growth of the p⁻ type multi-crystalline silicon light-soaking film 26 is 0.5 micrometer/minute and lasts for 30 minutes. The thickness of the p⁻ type multi-crystalline silicon light-soaking film 26 is 1 to 15 micrometers. The size of the grains 261 of the p⁻ type multi-crystalline silicon light-soaking film 26 is larger than 10 micrometers. The concentration of the boron atoms in the p⁻ type multi-crystalline silicon light-soaking film 26 is $10^{16}$ to $10^{17}$ #/cm³.

At 800 to 1000 degrees Celsius, phosphine is deposited on the p⁻ type multi-crystalline silicon light-soaking film 26, thus executing the n⁺ type deposition of the phosphor atoms of the phosphine on the p⁻ type multi-crystalline silicon light-soaking film 26. That is, an n⁺ type multi-crystalline silicon emitter 27 is form on the p⁻ type multi-crystalline silicon light-soaking film 26. The thickness of the n⁺ type multi-crystalline silicon emitter 27 is smaller than 1000 angstroms. The concentration of the boron atoms in the n⁺ type multi-crystalline silicon emitter 27 is $10^{18}$ to $10^{19}$ #/cm³. The n⁺ type multi-crystalline silicon emitter 27, the p⁻ type multi-crystalline silicon light-soaking film 26 and the p⁺ type multi-crystalline silicon back surface field film 25 together form a n⁺-p⁻-p⁺ laminate 1.

Figure 8:
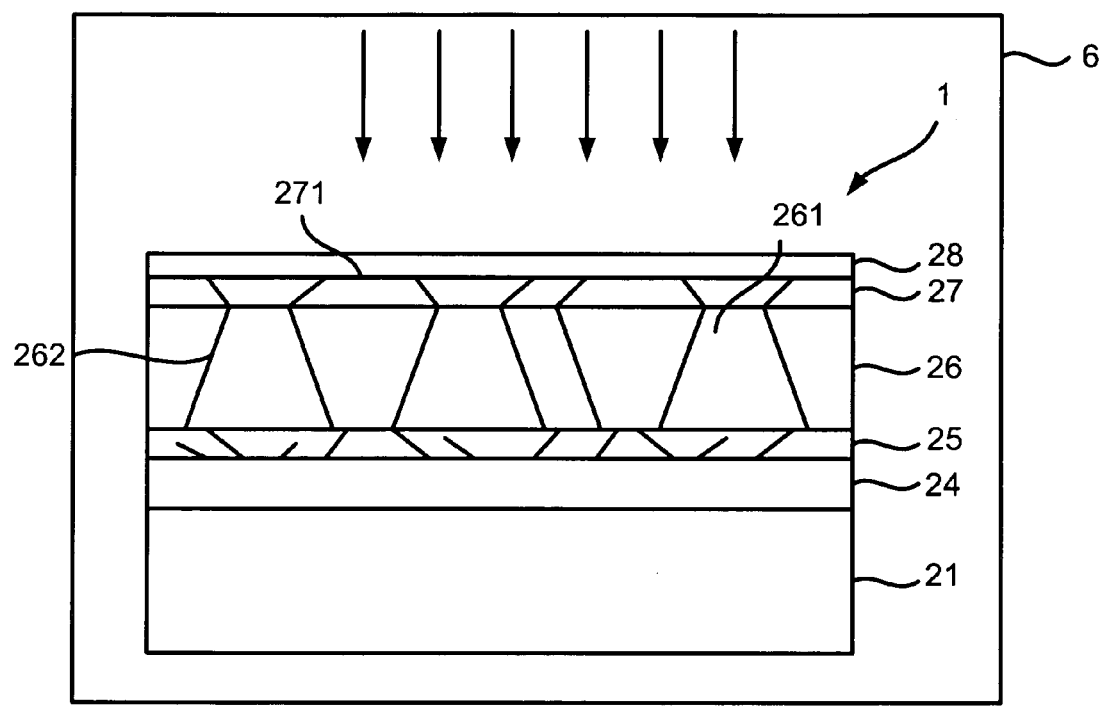
FIG. 8 is a side view of a plasma-enhanced chemical vapor deposition apparatus for providing SiCNO:Ar plasma to coat an anti-reflection film on the n-i-p multi-crystalline silicon laminate shown in FIG. 7.

Referring to FIGS. 1 and 8, at 16, SiCNO:Ar plasma is provided in a PECVD apparatus 6. Silane, nitrous oxide and methane are used as the raw materials of the SiCNO:Ar plasma while argon is used as a carrier. The SiCNO:Ar plasma passivates the n⁺-p⁻-p⁺ laminate 1. Hence, the dangling bonds of the silicon atoms on the surface 271 of the n⁺ type multi-crystalline silicon emitter 27 are filled. The dangling bonds of the silicon atoms at the grain boundaries 262 between the grains 261 of the p⁻ type multi-crystalline silicon light-soaking film 26 are also filled. The dangling bonds of the silicon atoms in the p⁺ type multi-crystalline silicon back surface field film 25 are also filled. Moreover, an anti-reflection film 28 of $SiCN/SiO_2$ is coated on the n⁺ type multi-crystalline silicon emitter 27.

Figure 9:
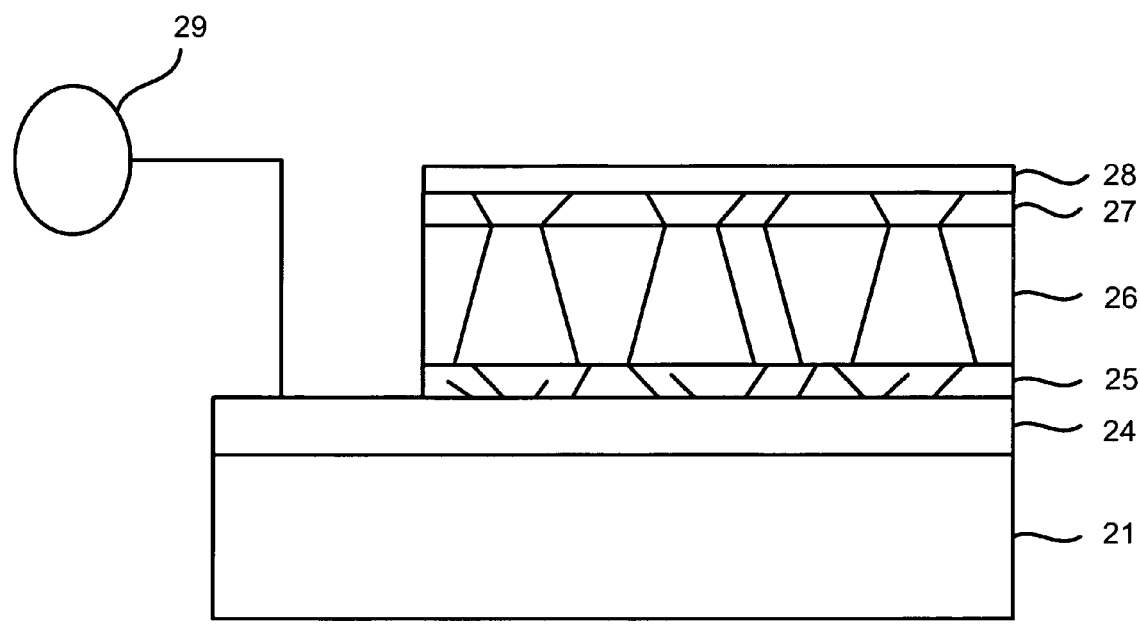
FIG. 9 is a side view of a $p^-$ type ohm contact provided on the laminate shown in FIG. 6.

Referring to FIGS. 1 and 9, at 17, potassium hydroxide solution is used to etch the multi-crystalline silicon laminate in a patterned mask process. The substrate 21 and the titanium/silicon alloy film 24 are not etched at all. A p⁻ type ohmic contact 29 is made on the titanium/silicon alloy film 24.

Figure 10:
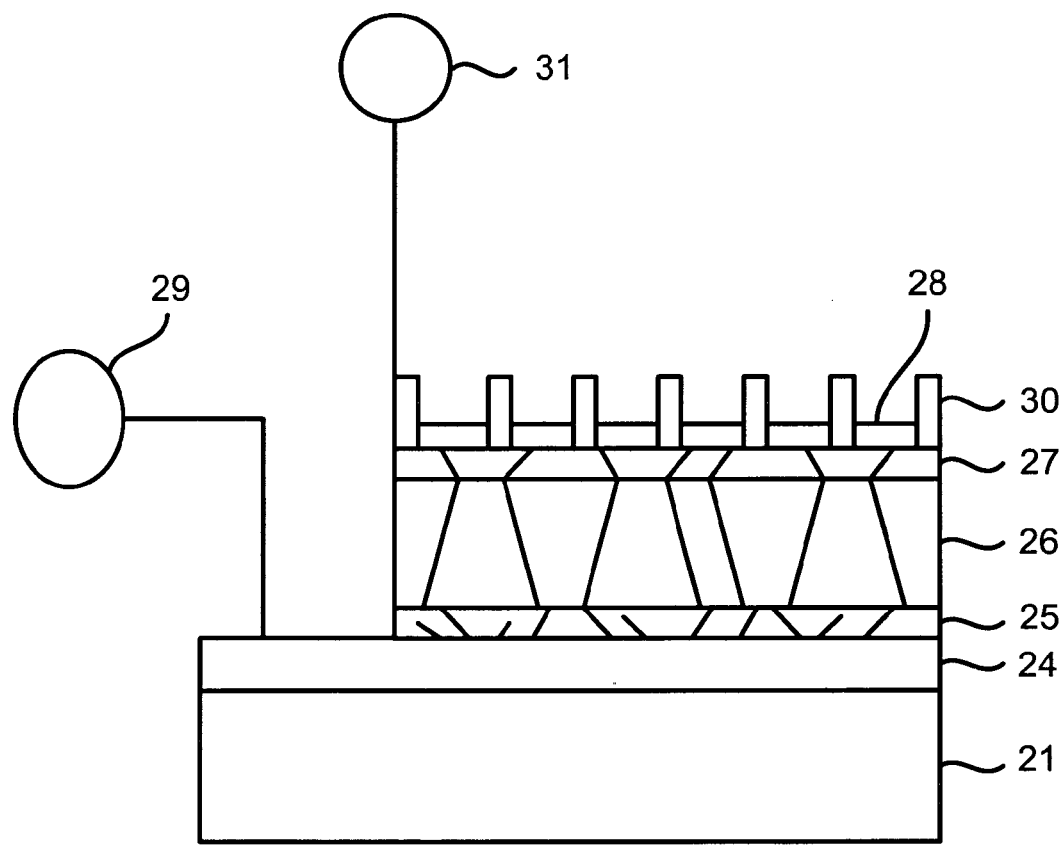
FIG. 10 is a side view of an $n^-$ type ohm contact connected to the anti-reflection film shown in FIG. 9.
Figure 11:
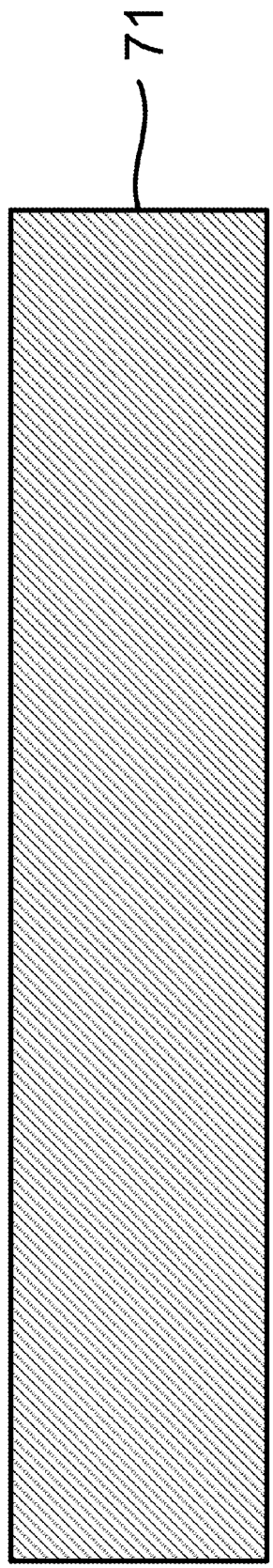
FIG. 11 is a side view of a substrate for use in a conventional process for making a multi-crystalline silicon film.
Figure 12:
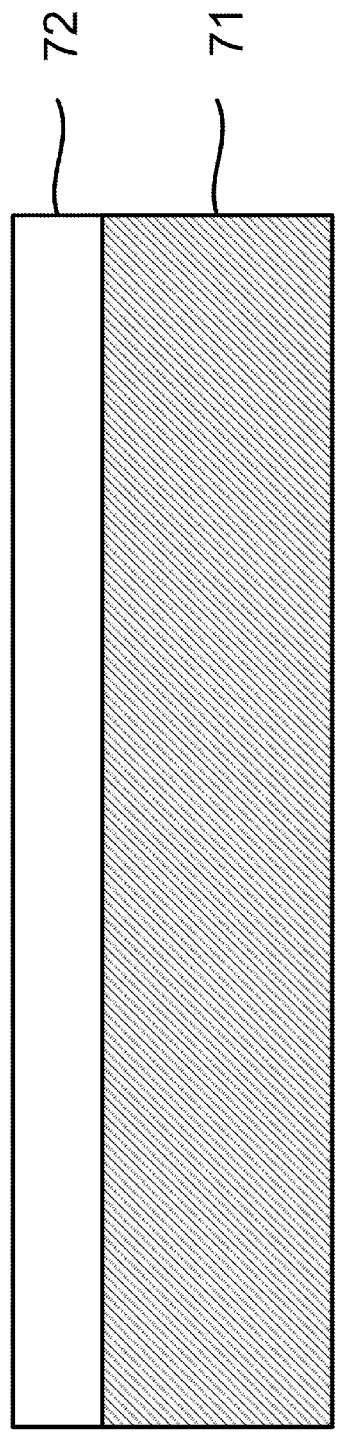
FIG. 12 is a side view of an aluminum film coated on the substrate shown in FIG. 11.
Figure 13:
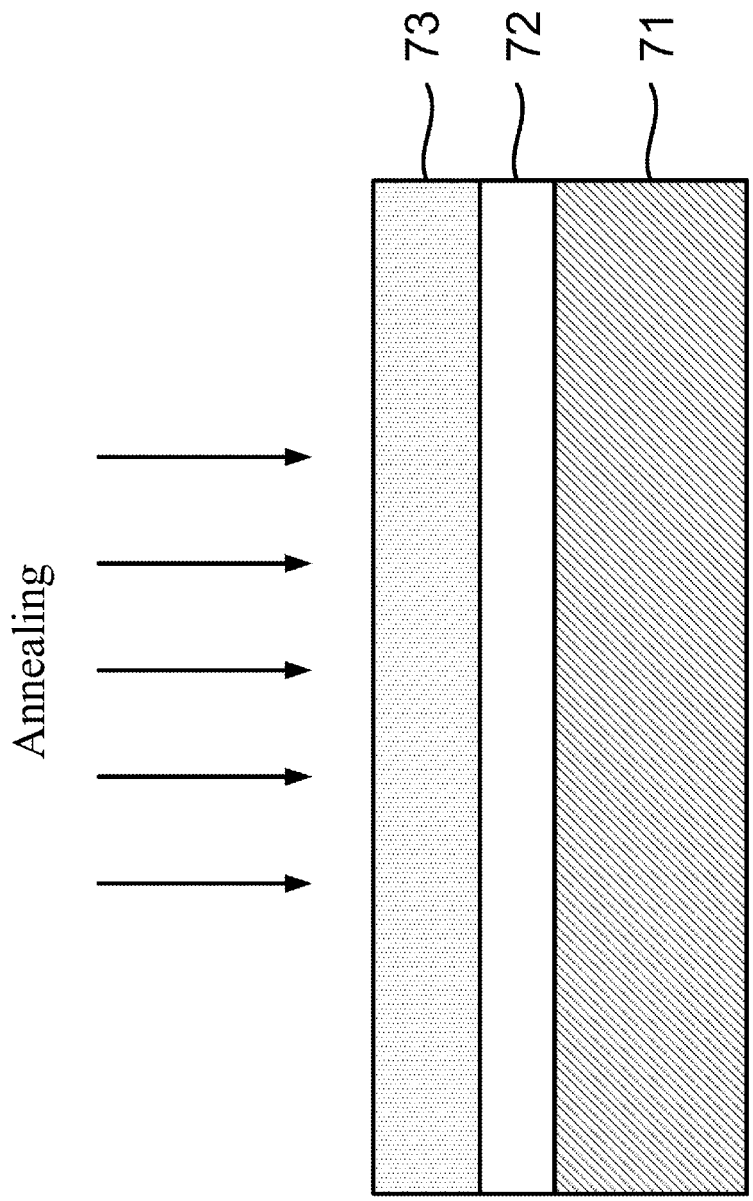
FIG. 13 is a side view of an amorphous silicon film coated on the aluminum film shown in FIG. 12.
Figure 14:
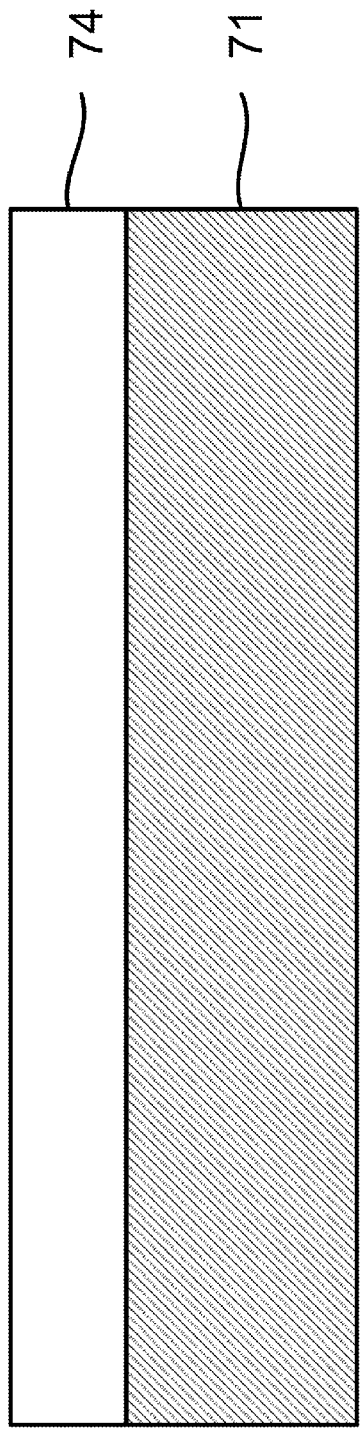
FIG. 14 is a side view of the substrate coated with a seed film converted from the amorphous silicon film and the aluminum film of FIG. 13.
Figure 15:
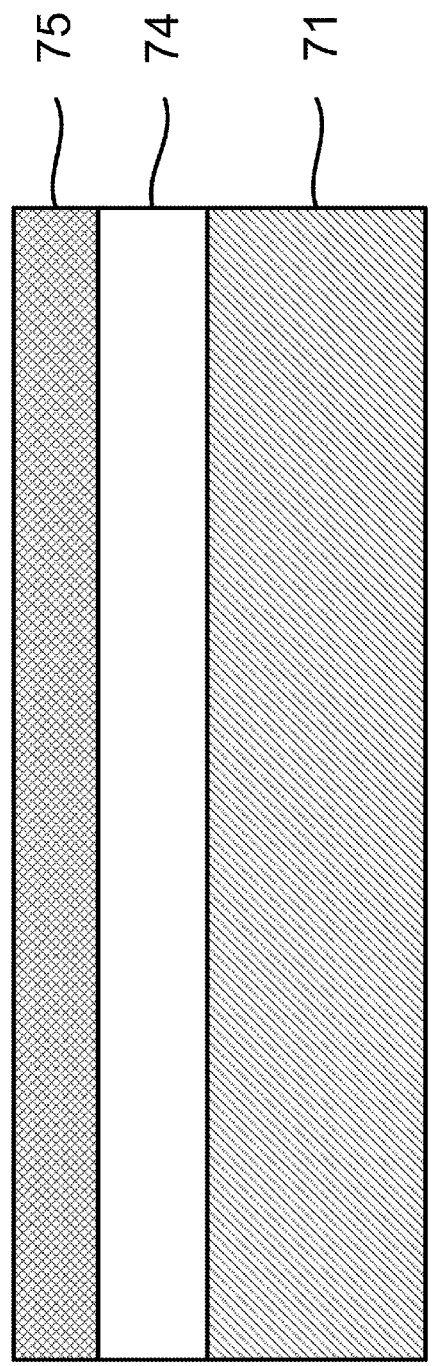
FIG. 15 is a side view of a multi-crystalline silicon film coated on the seed film shown in FIG. 14.

Referring to FIGS. 1 and 10, at 18, the anti-reflection film 28 are etched in a patterned mask process so that portions of the n⁺ type multi-crystalline silicon emitter 27 are exposed from the anti-reflection film 28. A titanium/palladium/silver alloy film 30 is provided in the exposed portions of the n⁺ type multi-crystalline silicon emitter 27 and annealed in the high-temperature annealing apparatus 5. Finally, an n⁻ type ohmic contact 31 is provided on the titanium/palladium/silver alloy film 30.

As discussed above, the multi-crystalline silicon laminate 1 includes the ceramic substrate 21 and the titanium/silicon alloy film 24 used as the seed layer. The APCVD apparatus 6 is used in the high-temperature process for the exchange of the silicon atoms and the boron atoms, thus forming the p⁺ type multi-crystalline silicon back surface field film 25 and the p⁻ type multi-crystalline silicon light-soaking film 26. Then, the phosphor atoms and the silicon atoms are exchanged so that the n⁺ type multi-crystalline silicon emitter 28 is made. The SiCNO:Ar plasma is used to passivate the laminate 1. The patterned mask process is used to make the p⁻ type ohmic contact 29 on the titanium/silicon alloy film 24. The patterned mask process is used to coat the titanium/palladium/silver alloy film 30 on the n⁺ type multi-crystalline silicon emitter 27 and provide the n⁻ type ohmic contact 31 on the n⁺ type multi-crystalline silicon emitter 27.

Solar cells made in the process according to the present invention exhibits several advantages. The ceramic substrate 21 is inexpensive, refractory and chemically stable, and can be integrated with materials for construction.

The titanium/silicon alloy film 24 is environmentally friendly, abundant and inexpensive. The titanium/silicon alloy film 24 ensures the integrity of the multi-crystalline silicon laminate 1 since its thermal expansion coefficient is matched with that of the ceramic substrate 21 and the p⁺ type multi-crystalline silicon back surface field film 25.

The solar cells provide a high photoelectrical conversion efficiency and excellent light-soaking stability because the PEVCD apparatus 6 is used in the high-temperature process to passivate the multi-crystalline silicon films that would otherwise involve high mobility and a large diffusion length, and take long for recombination.

Moreover, the process of the present invention provides a high epitaxial growth rate and a high crystal quality.

The present invention has been described via the detailed illustration of the preferred embodiment. Those skilled in the art can derive variations from the preferred embodiment without departing from the scope of the present invention. Therefore, the preferred embodiment shall not limit the scope of the present invention defined in the claims.

The invention claimed is:

1. A process for making a tandem solar cell comprising the steps of:
   providing a ceramic substrate;
   providing a titanium-based alloy film on the ceramic substrate;
   providing an n⁺-p⁻-p⁺ laminate on the titanium-based alloy film by the steps of:
   using an atmospheric pressure chemical vapor deposition apparatus to deposit dichlorosilane and diborane on the titanium-based alloy film, thus causing the epitaxial growth of a p⁺ type back surface field film on the titanium-based alloy film;
   raising the temperature in the atmospheric pressure chemical vapor deposition apparatus, thus causing the epitaxial growth of a p⁻ type light-soaking film on the p⁺ type back surface field film; and
   conducting n⁺ type deposition of phosphine on the p⁻ type light-soaking film, thus forming an n⁺ type emitter on the p⁻ type light-soaking film;
   using a plasma-enhanced chemical vapor deposition apparatus providing SiCNO:Ar plasma for passivating the n⁺-p⁻-p⁺ laminate, thus forming an anti-reflection film of $SiCN/SiO_2$ on the n⁺ type emitter;
   using potassium hydroxide solution for etching a portion of the n⁺-p⁻-p⁺ laminate in a patterned mask process;
   forming a p⁻ type ohmic contact on a portion of the titanium-based alloy film exposed from the n⁺-p⁻-p⁺ laminate;
   etching portions of the anti-reflection film in a patterned mask process;
   providing a titanium/palladium/silver alloy film on portions of the n⁺ type emitter exposed from the anti-reflection film;
   annealing the titanium/palladium/silver alloy film in hydrogen; and
   forming an n⁻ type ohmic contact on the n⁺ type emitter.

2. The process according to claim 1, wherein the thickness of the ceramic substrate is 0.1 to 1.0 mm.

3. The process according to claim 1, wherein the step of providing the titanium-based alloy film comprising the steps of:
   providing a titanium film on the ceramic substrate; and
   depositing dichlorosilane on the titanium film in an atmospheric pressure chemical vapor deposition apparatus so that the dichlorosilane and the titanium film exchange silicon atoms and titanium atoms to form the titanium/silicon alloy film.

4. The process according to claim 3, wherein the thickness of the titanium film is 500 to 5000 angstroms.

5. The process according to claim 1, wherein the step of providing the titanium-based alloy film comprising the steps of:
   providing a titanium film and an amorphous silicon film on the ceramic substrate; and
   heating the titanium film and the amorphous silicon film in a high-temperature annealing apparatus so that they exchange titanium atoms and silicon atoms, thus forming the titanium/silicon alloy film.

6. The process according to claim 5, wherein the step of providing the titanium film and the amorphous silicon film comprises the steps of:
   providing the titanium film on the ceramic substrate in an e-gun evaporation system; and
   providing the amorphous silicon film on the titanium film in a plasma-enhanced chemical vapor deposition apparatus.

7. The process according to claim 5, wherein the step of providing the titanium film and the amorphous silicon film comprises the steps of:
   providing the amorphous silicon film on the ceramic substrate in a plasma-enhanced chemical vapor deposition apparatus; and
   providing the titanium film on the amorphous silicon film in an e-gun evaporation system.

8. The process according to claim 5, wherein ratio of the thickness of the amorphous silicon film to the thickness of the titanium film is 2:1.

9. The process according to claim 8, wherein the thickness of the amorphous silicon film is 1000 to 10000 angstroms, and the thickness of the titanium film is 500 to 5000 angstroms.

10. The process according to claim 5, wherein the titanium-based alloy film is used both as a back contact and a seed film.

11. The process according to claim 1, wherein the step of providing the titanium-based alloy film comprising the step of using the atmospheric pressure chemical vapor deposition apparatus to deposit dichlorosilane and titanium tetrachloride on the ceramic substrate.

12. The process according to claim 1, wherein the titanium-based alloy film is made of a material selected from a group consisting of $TiSi_2$, TiN, TiC, $TiB_2$ and $TiC_xN_y$.

13. The process according to claim 1, wherein the thickness of the titanium-based alloy film is 1000 to 5000 angstroms.

14. The process according to claim 1, wherein the grain size of the titanium-based alloy film is in the order of a micrometer.

15. The process according to claim 1, wherein the sheet resistance of the titanium-based alloy film is smaller than 0.5 ohm/cm².

16. The process according to claim 1, wherein the thickness of the p⁺ type back surface field film is no larger than 1 micrometer.

17. The process according to claim 1, wherein the thickness of the $p^-$ type light-soaking film is 1 to 15 micrometers, and the grain size of the $p^-$ type light-soaking film is larger than 10 micrometers.

18. The process according to claim 1, wherein the thickness of the $n^+$ type emitter is smaller than 1000 angstroms.

19. The process according to claim 1, wherein the dangling bonds of the silicon atoms on the surface of the $n^+$ type emitter and at the grain boundaries in the $p^-$ type light-soaking film and the $p^-$ type light-soaking film and the $p^+$ type back surface field film are filled during the passivation.

* * * * *